United States Patent
Lin et al.

(12) 
(10) Patent No.: US 6,808,979 B1
(45) Date of Patent: Oct. 26, 2004

(54) METHOD FOR FORMING VERTICAL TRANSISTOR AND TRENCH CAPACITOR

(75) Inventors: Shian-Jyh Lin, Chiayi (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/640,097

(22) Filed: Aug. 13, 2003

(30) Foreign Application Priority Data

Apr. 29, 2003 (TW) ........................................ 92109975 A

(51) Int. Cl.$^7$ .......................................... H01L 21/8242
(52) U.S. Cl. ........................ 438/242; 438/243; 438/246; 438/249; 438/270; 438/386; 438/389; 438/392
(58) Field of Search ................................. 438/242–249, 438/270, 294, 386–392, 424

(56) References Cited

U.S. PATENT DOCUMENTS

| | | | | |
|---|---|---|---|---|
| 5,516,721 A | * | 5/1996 | Galli et al. ................. | 438/424 |
| 5,665,624 A | * | 9/1997 | Hong .......................... | 438/244 |
| 5,831,301 A | * | 11/1998 | Horak et al. ................. | 257/302 |
| 5,985,729 A | * | 11/1999 | Wu .............................. | 438/389 |
| 6,335,247 B1 | * | 1/2002 | Tews et al. .................. | 438/270 |
| 6,368,912 B1 | * | 4/2002 | Chang et al. ................ | 438/248 |
| 6,391,705 B1 | * | 5/2002 | Hsiao et al. ................. | 438/243 |
| 6,489,646 B1 | * | 12/2002 | Jang ........................... | 257/296 |
| 6,552,382 B1 | * | 4/2003 | Wu .............................. | 257/305 |
| 6,642,566 B1 | * | 11/2003 | Mandelman et al. ....... | 257/302 |

* cited by examiner

*Primary Examiner*—Amir Zarabian
*Assistant Examiner*—Khanh Duong
(74) *Attorney, Agent, or Firm*—Quintero Law Office

(57) ABSTRACT

A method for forming a vertical transistor and a trench capacitor. A semiconductor substrate having a pad stacked layer on the surface and a trench formed therein is provided. A capacitor is formed at the bottom part of the trench and a portion of the upper sidewall of the trench is exposed. A conductive wire is then formed on the capacitor, followed by forming a dielectric layer on the exposed sidewalls of the trench. A trench top dielectric is then formed by liquid phase deposition on the conductive wire. A transistor is then formed on the trench top dielectric, which isolates the transistor from the capacitor.

19 Claims, 4 Drawing Sheets

METHOD FOR FORMING VERTICAL TRANSISTOR AND TRENCH CAPACITOR

BACKGROUND OF THE INVENTION

1. Field of the Invention

The present invention relates to a semiconductor process for fabricating memory cells, and in particular to method for forming a vertical transistor and a trench capacitor.

2. Description of the Art

In the process for fabricating integrated circuits with higher integration density, size reduction for each memory cell and power consumption must be considered and optimized in order to enhance its access speed. Conventional designs for planar transistors tend to decrease the gate lengths in transistors, thus reducing lateral areas of each memory cell. However, leakage resistance of the gate is decreased and the voltage applied on the wordline must be relatively reduced. Consequently, electric charges stored in capacitors decrease. Due to the above, capacitors with greater capacitance must be considered for shortened lateral gate lengths. Methods for increasing capacitance of a capacitor include increasing capacitor area, and reducing effective thickness of the dielectric layer between plates. In practical applications, reduced memory cell areas and increased capacitor areas cannot be satisfied simultaneously. Reduction of the effective thickness of the dielectric layer is also limited.

Hence, vertical transistor structures are widely applied in the semiconductor industry. By doing so, it is possible to have appropriate gate length for obtaining a low leakage, without reducing the voltage applied on wordlines or increasing the lateral area of memory cells. Moreover, the method also features the formation of a deep trench capacitor directly below the vertical transistor, which greatly reduces the area occupied by memory cells.

A current process for a vertical transistor and a trench capacitor is shown in FIG. 1. After the formation of a deep trench capacitor C (comprising a plate 20, a capacitor dielectric layer 18 and a buried plate 16), a conductive wire (consisting of a collar dielectric layer 21, a first conductive layer 24 and a second conductive layer 22) is formed on the capacitor. Next, high density plasma (HDP) is used to form a trench top oxide (TTO) 26 on the conductive wire for isolation. A transistor (consisting of a gate oxide 28, a conductive layer (not shown), a spacer (not shown), and a source/drain are then formed to complete the vertical transistor and the trench capacitor.

However, in the above-mentioned method, the surface of the TTO 26, formed by HDP, tends to incline from one end to the other, as shown in FIG. 1. An ideal TTO with a planar surface is difficult to obtain due to the restrictions of the HDP process. In addition, if uniformity of the TTO is not satisfactory, one sidewall of the trench is not sufficiently protected by the oxide layer, thus insulation is not satisfactory. Consequently, excess ion diffusion (such as As) under the vertical transistor occurs. This brings adverse effects to the reliability of the gate oxide, and overall performance of the element deteriorates.

SUMMARY OF THE INVENTION

Accordingly, an object of the invention is to provide a method for forming a vertical transistor and a trench capacitor to overcome conventional problems and meet the quality requirements.

The invention features the formation of the trench top oxide (TTO) by liquid phase deposition (LDP). In a LDP process, a wafer is completely dipped into a chemical solution, thus avoiding the conventional problem of deposition angle associated with the high density plasma process. The trench top oxide is evenly and uniformly formed in the trench to acquire a TTO with a smooth, uniform and planar surface.

In order to achieve the above object, the invention provides a method for forming a vertical transistor and a trench capacitor. The method includes the steps of: providing a semiconductor substrate having a pad stacked layer on the surface and a trench formed therein is provided; forming a trench capacitor at a bottom part of the trench and partially exposes the sidewall; forming a conductive wire on top of the trench capacitor in the trench; forming a dielectric layer on the exposed sidewall of the trench; forming a trench top dielectric by liquid phase deposition on the conductive wire; and forming a vertical transistor on the trench top dielectric, which isolates the vertical transistor from the trench capacitor.

According to the method provided, a TTO with a planar surface and a uniform thickness is formed. Therefore, an excellent insulation effect is obtained, and reliability of the gate oxide formed in the follow-up steps is enhanced. Semiconductor elements with excellent characteristics are then obtained.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

FIGS. 2A~2F are cross sections illustrating the process of the embodiment of the invention.

Figure 1:
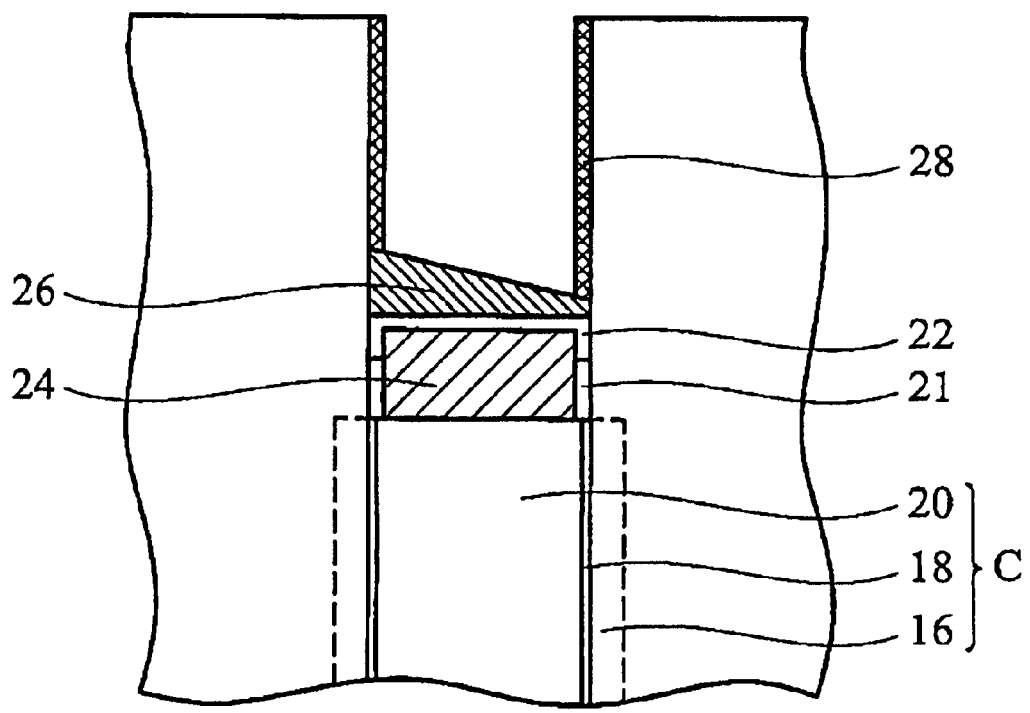
FIG. 1 is cross section showing a conventional vertical transistor and a trench capacitor.
Figure 2A:
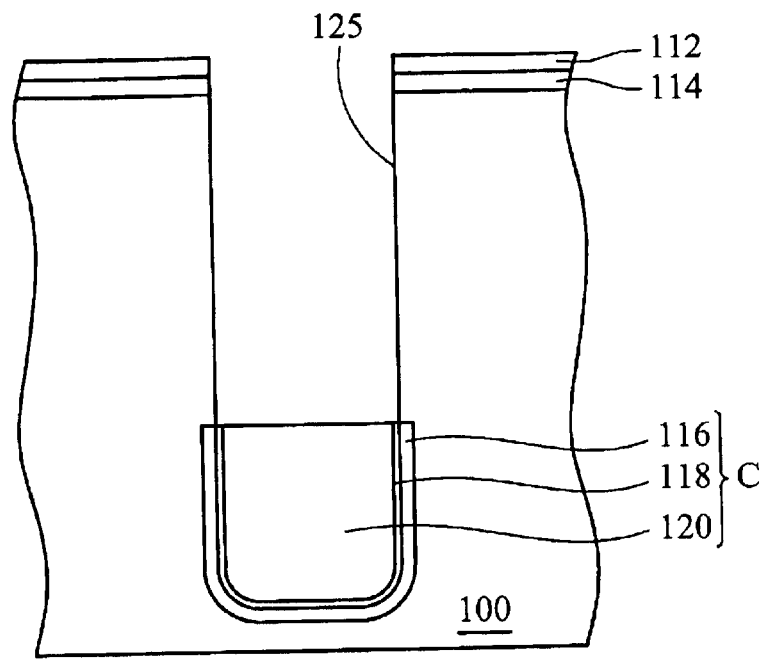
FIGS. 2A~2F are cross sections illustrating the process of the method provided in the invention.

As shown in FIG. 2A, a semiconductor substrate 100 having a pad stacked layer (comprises an oxide layer 114 and a nitride layer 112) formed on the surface is provided. Next, a patterned photoresist layer (not shown) is used to define the position of a trench. Reactive ion etching is then used to form a trench 125 in the substrate 100.

Next, a capacitor C is formed at the bottom of the trench 125 by sequentially forming a buried plate 126, a capacitor dielectric layer 118 and a plate 120. The buried plate is, for example, an N+ doped region, located in the substrate surrounding the bottom of the trench 125. The plate 120 is preferably doped polysilicon and the capacitor dielectric layer 118 is preferably an oxide-nitride (ON) structure, or oxide-nitride-oxide (ONO). In detail the process for forming the trench capacitor begins with the formation of an N+doped dielectric layer such as Arsenic doped silicon glass (ASG), covering the sidewall and the bottom of the trench 125. Photoresist material is then formed in the trench 125 to a certain depth, followed by wet etching to remove the doped dielectric layer not covered by the photoresist material. The photoresist material is then removed, and an insulation layer, such as tetraethylorthosilane, is conformally formed. The insulation layer is formed to prevent diffusion of doped ions out to the substrate around the trench 125 not protected by the doped dielectric layer in the follow-up thermal process. Next, ions doped in the doped dielectric layer are driven to the substrate to form an N+ doped region, on the buried plate 116. The insulation layer and the doped dielectric layers are then removed, followed by the formation of a dielectric layer on the sidewall and the bottom of the trench to form the capacitor dielectric layer 118. The plate 120 is then formed by filling the trench with conductive material.

Figure 2B:
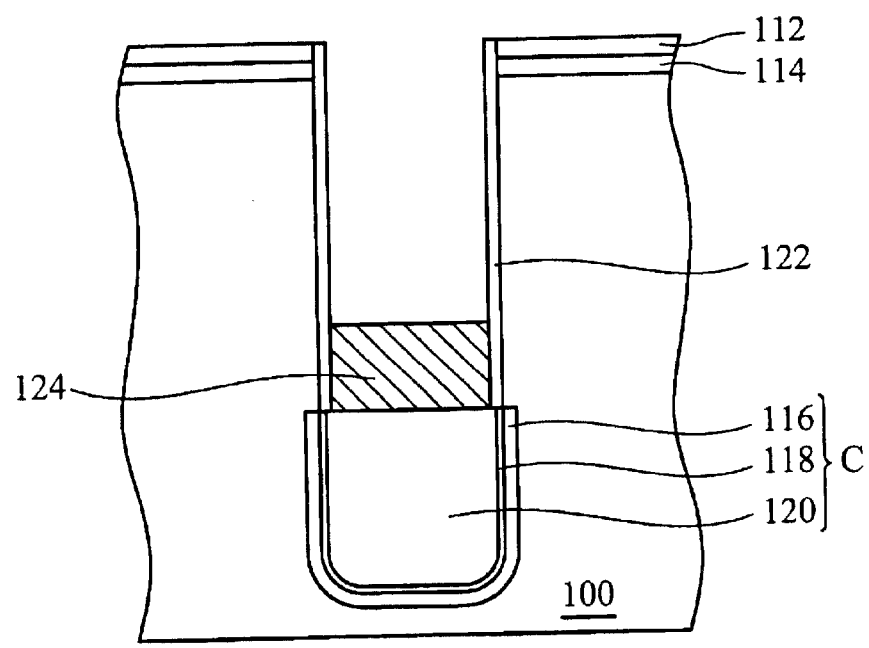
Figure 2C:
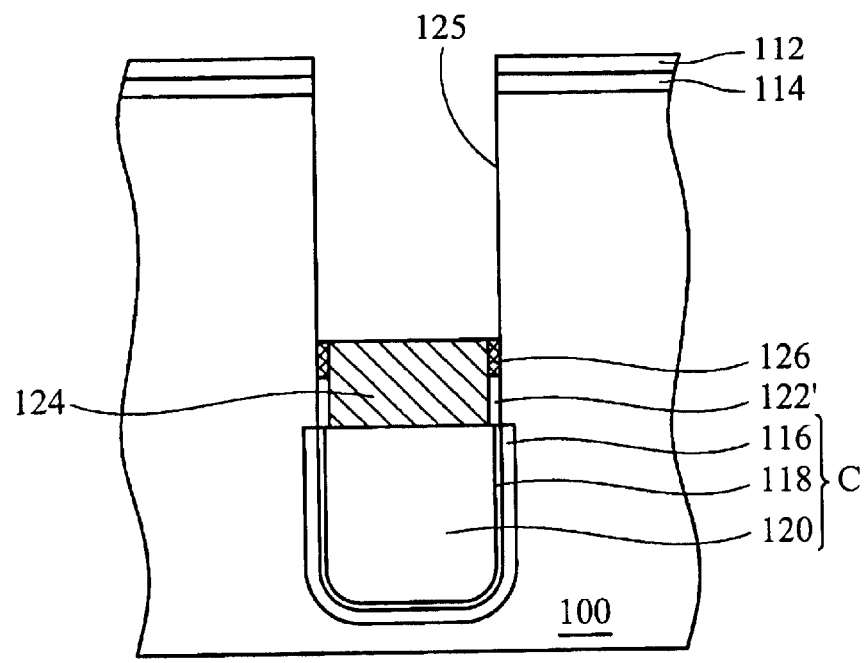

After the formation of the trench capacitor, as shown in FIG. 2B, an insulation layer, such as oxide, is s conformally formed. Etching is then used to remove the insulation 122 from the pad stacked layer and from the capacitor. A first conductive layer 124 is then formed to fill the trench 125, followed by etching back to lower its surface to a certain depth. Again, etching back is performed to lower the surface of the insulation layer 122 to a level below the conductive layer 124 to form a collar dielectric layer 122', as shown in FIG. 2C. A second conductive layer, such as undoped polysilicon or amorphous silicon is formed on the collar dielectric layer 122', followed by etching back to a level equal to the first conductive layer 124. The first conductive layer 124, the collar dielectric layer, 122' and the second conductive layer 126, thus form the conductive wire.

Figure 2D:
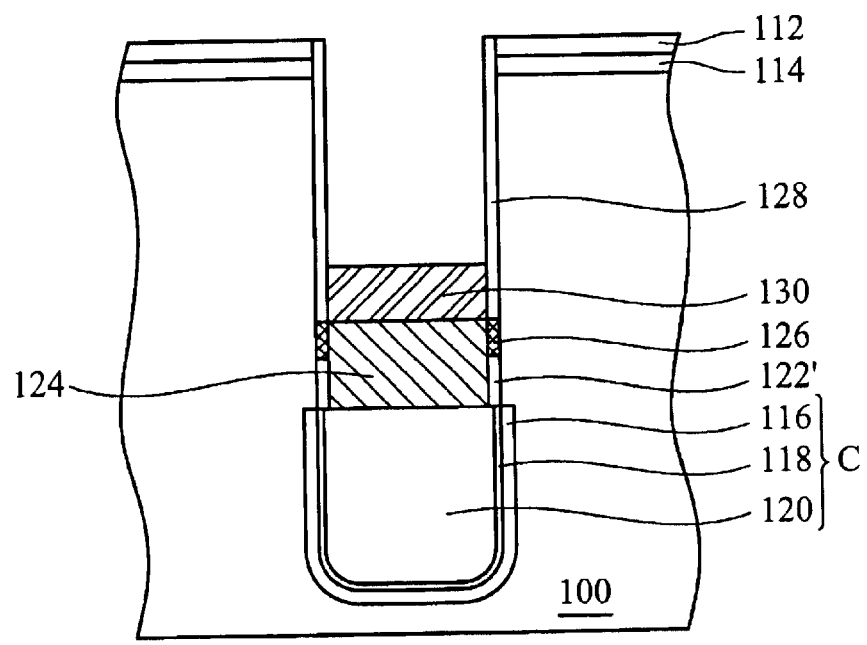

Next, as shown in FIG. 2D, a dielectric layer, such as SiN, is conformally formed to cover the nitride layer 112, along the sidewall of the trench and the first conductive layer 124, followed by isotropic etching to remove the nitride on the nitride layer 112 and the first conductive layer 124. Alternatively, the dielectric layer is oxynitride, or high dielectric constant materials, such as $Al_2O_3$, $HfO_2$, $Ta_2O_5$ and combinations of above dielectric films. The dielectric layer remaining on the sidewall is referred to as 128. Liquid phase deposition is then carried out at 0~80° C. to form a dielectric layer 130, as the trench top dielectric, to cover the first conductive layer 124. Preferable thickness of the trench top dielectric is 10~1000 angstroms. The trench top dielectric is used to isolate the conductive wire and the control gate formed in the follow-up process. In this embodiment, the trench top dielectric is oxide.

In the liquid phase deposition (LPD) process, the wafer is dipped into an $H_2SiF_6$ solution with titration of $H_3BO_3$ solution (or $H_2SiF_6$ titration with $H_2O$). Chemical reactions of the above process are as follows:

(1)

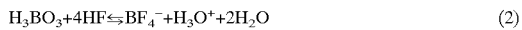(2)

In reaction (1), $SiO_2$ is deposited, and the reaction product HF is consumed in react-ion (2) to avoid reverse reaction. The deposition rate of $SiO_2$ is controlled by titration. Since the wafer is completely dipped into the solution, conventional problems associated with deposition angle when using high density plasma is avoided. As a result, the trench top dielectric is formed evenly and uniformly in the trench to obtain a trench top dielectric having a uniform thickness.

Figure 2E:
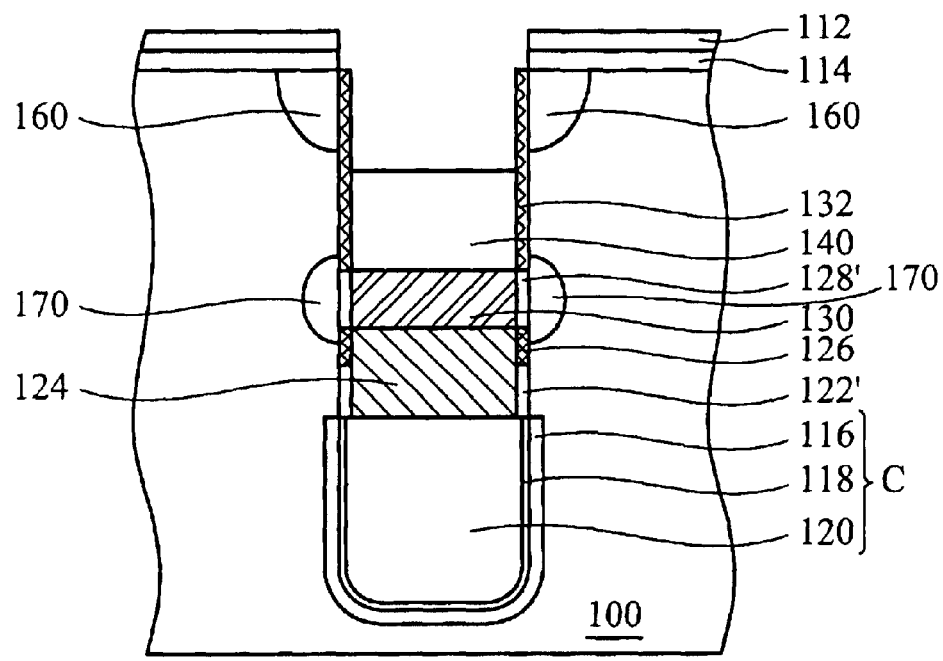

Next, as shown in FIG. 2E, wet etching is used to remove the dielectric layer 128 on the sidewall not covered by the trench top dielectric 130, and the dielectric layer 128' remains on both sides of the trench top dielectric. A conventional process is then performed to form a gate oxide 132 and a gate conductive layer 140 on the trench top dielectric 130. The gate conductive layer is preferably polysilicon, WSi, metal or combinations thereof. A preferable method for forming the gate oxide and the gate conductive layer is forming the gate oxide layer 132 on the sidewall of the trench by thermal oxidation, followed by filling the area surrounded by the gate oxide layer with conductive material to form the gate conductive layer 140. In this embodiment, the gate oxide layer 132 and the gate conductive layer 140, thus form a control gate. Ion implantation is then performed to form a doped region in the substrate around the top of the control gate to serve as a source 160 of the vertical transistor. Formation of a drain 170 is carried out by thermal diffusion to diffuse the doped ions in the first conductive layer 124 via the second conductive layer 126 into the substrate. An electrical connection between the capacitor to the control gate is then formed.

Then, an insulation material, such as oxide or nitride, is conformally formed covering the nitride layer 112 and the sidewall and the bottom of the trench.

Figure 2F:
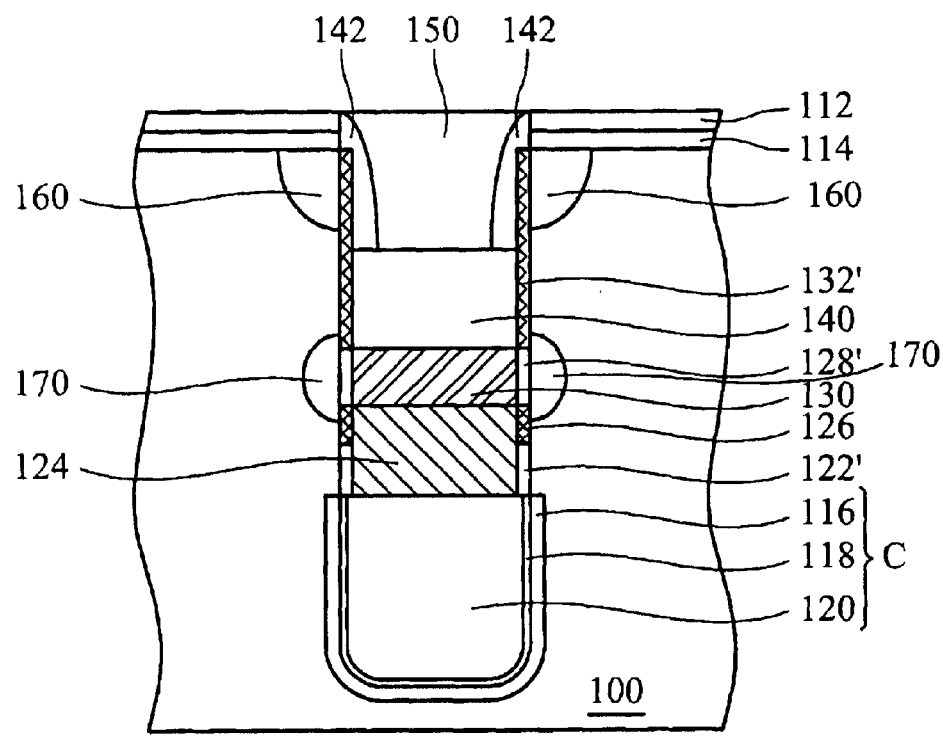

Anisotropic etching is carried out to remove a portion of the insulation layer without removing the insulation material on the sidewall. The insulation layer remaining on the sidewall is the spacer 142, as shown in FIG. 2F. Finally, a conductive layer, such as doped polysilicon, WSix, or metal, is formed by filling the trench, followed by chemical mechanical polishing to form a smooth surface. A conductive layer 150 is thus obtained, as shown in FIG. 2F.

According to the method provided in the invention, a trench top dielectric layer with a smooth/uniform surface is obtained by liquid phase deposition at a temperature range from 0 to 80° C. Consequently, the insulating effect is enhanced and the reliability of the overall performance of the semiconductor element is increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a vertical transistor and a trench capacitor, comprising:

providing a semiconductor substrate having a pad stacked layer on the surface and a trench formed therein;

forming a trench capacitor at a bottom part of the trench;

forming a conductive wire on top of the trench capacitor in the trench;

forming a dielectric layer on the sidewall of the trench;

forming a trench top dielectric by liquid phase deposition on the conductive wire;

out-diffusing ions doped in a first conductive layer to the surrounding substrate via a second conductive layer to form a drain: and forming a vertical transistor on the trench top dielectric, which isolates the vertical transistor from the trench capacitor.

2. The method as claimed, in claim 1, wherein the trench top dielectric is oxide.

3. The method as claimed in claim 1, wherein the pad stacked layer comprises a nitride layer and an oxide layer.

4. The method as claimed in claim 1, wherein the capacitor comprises a buried plate formed in the semiconductor substrate surrounding the bottom of the trench, a capacitor dielectric layer, formed conformally at the bottom part of the trench and an electrode plate filling the bottom part of the trench.

5. The method as claimed in claim 1, wherein the dielectric layer is nitride, oxynitride, or high dielectric constant materials, Al2O3, HfO2, Ta2O5 and combinations thereof.

6. The method as claimed in claim 1, wherein the conductive wire comprises a collar dielectric layer formed on the sidewall of the trench, a first conductive layer surrounded by the collar dielectric layer, wherein the height of the collar dielectric layer is lower than the first conductive layer and a second conductive layer formed on the collar dielectric layer to a height equal with the first conductive layer.

7. The method as claimed in claim 1, wherein the liquid phase deposition is carried out at a temperature range from 10 to 80° C.

8. The method as claimed in claim 1, wherein the liquid phase deposition is carried out in an H2SiF8 solution with titration of H3BO3 or H2SiF6 with titration of H2O.

9. The method as claimed in claim 1, further comprising ion implantation to form a doped region, serving as a source, near the top part of the trench within the semiconductor substrate.

10. The method as claimed in claim 1, wherein the transistor comprises a gate conductive layer, a sidewall spacer and a conductive layer.

11. A method for forming a vertical transistor and a trench capacitor, comprising:

providing a semiconductor substrate having a pad stacked layer on the surface and a trench formed therein;

forming a doped dielectric layer conformally on the sidewall of the trench up to a predetermined height and diffusing doped ions out to the substrate to form a buried plate surrounding the trench;

removing the doped dielectric layer;

forming a capacitor dielectric layer conformally on the sidewall of the trench up to the predetermined height;

forming an electrode plate by filling conductive material into the area surrounded by the capacitor dielectric layer;

forming a collar dielectric layer on the exposed sidewall of the trench;

forming a first conductive layer in the area surrounded by the collar dielectric layer;

removing a portion of the collar dielectric layer so that the surface of the collar dielectric layer is lower than the first conductive layer;

forming a second conductive layer on the collar dielectric layer, wherein the height of the second conductive layer is equal to that of the first conductive layer;

forming a dielectric layer on the sidewall of the trench;

removing the dielectric layer on the first conductive layer by isotropic etching;

forming a trench top oxide having uniform thickness in the trench to cover the first conductive layer by liquid phase deposition;

removing the dielectric layer not covered by the trench top oxide;

forming a gate oxide layer on the sidewall of the trench;

forming a gate conductive layer by filling conductive material in the area surrounded by the gate oxide;

forming a spacer on the sidewall of the trench; and forming a conductive layer by filling conductive material in the trench.

12. The method as claimed in claim 11, wherein the pad stacked layer comprises a nitride layer and an oxide layer.

13. The method as claimed in claim 11, wherein the dielectric layer is nitride, oxynitride, or high dielectric constant materials, Al2O3, HfO2, Ta2O5 and combinations thereof.

14. The method as claimed in claim 11, wherein the liquid phase deposition is carried out at a temperature range from 0 to 80° C.

15. The method as claimed in claim 11, wherein the gate conductive layer is polysilicon.

16. The method as claimed in claim 11, wherein the spacer is nitride or oxide.

17. The method as claimed in claim 11, wherein the conductive layer is polysilicon, WSix, or metal.

18. The method as claimed in claim 11, further comprising an ion implantation step to form a doped region, serving as a source, in the semiconductor substrate near the trench top.

19. The method As claimed in claim 11, further comprising out-diffusing ions doped in the first conductive layer via the second conductive layer to the substrate to form a drain.

* * * * *